United States Patent [19]

Benz

[11] Patent Number: 5,114,912

[45] Date of Patent: May 19, 1992

[54] TWO-DIMENSIONAL, JOSEPHSON-ARRAY, VOLTAGE-TUNABLE, HIGH-FREQUENCY OSCILLATOR

[75] Inventor: Samuel P. Benz, Boulder, Colo.

[73] Assignee: The United States of America as represented by the Secretary of Commerce, Washington, D.C.

[21] Appl. No.: 699,282

[22] Filed: May 13, 1991

[51] Int. Cl.$^5$ .............................................. H03B 15/00
[52] U.S. Cl. ....................................... 505/1; 331/56; 331/107 S; 357/5; 505/702; 505/854
[58] Field of Search ............ 331/107 S, 56; 307/306; 505/853, 854, 701, 702; 357/5

[56] References Cited

U.S. PATENT DOCUMENTS

| | | | |
|---|---|---|---|
| 3,628,184 | 12/1971 | Thompson | 331/107 S |
| 3,822,381 | 7/1974 | Scott | 331/107 S X |
| 3,916,340 | 10/1975 | Scott | 331/107 S |
| 3,970,965 | 7/1976 | Shaprio et al. | 331/107 S |
| 4,344,052 | 8/1982 | Davidson | 331/107 S X |
| 4,468,635 | 8/1984 | Lukens et al. | 331/107 S |
| 4,470,023 | 9/1984 | Lukens et al. | 331/107 S |

OTHER PUBLICATIONS

Applied Physics Letters publication by Wan et al., entitled "Submillimeter Wave Generation Using Josephson Junction Arrays", 54 (18), May 1, 1989, pp. 1805–1807.

Primary Examiner—Siegfried H. Grimm
Attorney, Agent, or Firm—Holly D. Kozlowski

[57] ABSTRACT

A two-dimensional array of Josephson junctions is used as a high-frequency oscillator capable of emitting coherent power of predetermined frequencies since the geometry of the two-dimensional array allows the individual Josephson junctions to phase lock at predetermined frequencies. The array is controlled at a given voltage and excited by the application of DC current through the array, in effect providing a rapidly tunable DC-to-AC converter at GHz and THz frequencies. The oscillator operates without the application of external high frequency signals or a connection to a cavity resonator. Load matching and other adjustments can be made by selecting the appropriate number of Josephson junctions in the array, selecting a damping factor which determines non-hysteretic operation, adding resistive shunts or a superconducting ground plane. The two-dimensional array used as an oscillator has advantages over one dimensional arrays in that voltage equalization from junction-to-junction occurs naturally so that phase locking is less likely to be affected by non-identical junctions, greater power output can be realized, an output having a narrower line width is produced and impedance matching is relatively easy.

34 Claims, 5 Drawing Sheets

5,114,912

TWO-DIMENSIONAL, JOSEPHSON-ARRAY, VOLTAGE-TUNABLE, HIGH-FREQUENCY OSCILLATOR

TECHNICAL FIELD

The present invention relates generally to voltage-controlled, high-frequency oscillators, and more particularly to arrays of superconducting Josephson junctions arranged to emit coherent power at predetermined frequencies.

BACKGROUND ART

Josephson junctions are the weak connections between superconductors through which the Josephson effects are realized. Normally these junctions have a superconductor-insulator-superconductor configuration. However, the Josephson effect is observed in other configurations, such as a superconductor-normal metal-superconductor arrangement. Another configuration of a Josephson junction is a point contact in which a sharply pointed superconductor is brought into contact with a blunt superconductor. Thin-film microbridges can also form Josephson junctions. The simplest of these is a short narrow constriction on the order of a few micrometers in a superconducting film known as an Anderson-Dayem bridge. Other types of Josephson junctions are superconductor-semiconductor-superconductor, superconductor-oxide-normal metal-superconductor, as well as other artificial-barrier tunnel junctions. A Josephson junction can also be formed from the so-called SLUG junction consisting of a drop of lead-tin solder solidified around a niobium wire.

The DC current-voltage characteristics for different types of Josephson junctions may differ, but all show a zero-voltage supercurrent, and constant-voltage steps can be induced into the DC characteristics at voltages given by the following equation:

$$V = nh\nu/2e$$

where n is an integer, h is Planck's constant, $\nu$ is the frequency of a voltage imposed across the barrier of the junction, and e is the magnitude of the charge of an electron.

Josephson junctions are used for extremely precise frequency-to-voltage conversion, and for measurement of absolute temperature. Josephson junctions, and instruments incorporating Josephson junctions, are also useful in other applications such as metrology at DC and microwave frequencies, magnetometry, detection and amplification of electromagnetic signals, and high-speed analog-to-digital converters and computers.

Josephson junctions can also be used as high frequency generators. When a Josephson junction is appropriately biased, its supercurrent oscillates at a well-defined fundamental frequency:

$$\nu = V/\phi_0$$

where $\phi_0 \approx 2.07 \text{mV/THz}$, and V is the time-averaged voltage across the junction. If the junction is biased such that $V \geq i_c R$, where R is the junction resistance and $i_c$ is its critical current (a current value below which the junction is in the zero-resistance state), then the time-dependent voltage (output signal) is nearly sinusoidal. Under these conditions, the maximum power coupled to a matched load (where R equals $R_L$) is $P = i_c^2 R/8$. The theory and operation of Josephson junctions are described in the publications listed in the Appendix hereto, and incorporated herein by reference.

A single Josephson junction has been shown to couple 10nW to a neighboring junction at one THz, as described in the Robertazzi publication[1] (see Appendix). However, there are two problems with single junction high frequency oscillators, a limited output power and output resistances that are too low to match typical load impedances, such as 50Ω. To overcome these drawbacks, a series array of identical Josephson junctions has been used as a high frequency oscillator. The impedance of the series array can be chosen to match the load impedance by choosing the appropriate number of junctions, such that the number of junctions $N = R_L/R$. This arrangement is shown in the Tilley publication[2] (see Appendix).

In a series array of Josephson junctions, if all the junctions can be made to oscillate with the same phase and frequency without applying external radiation or excitation, the junctions are considered mutually phase-locked and the array emits coherent radiation to a matched load at a power level N times that of a single junction. The output power of an array of N Josephson junctions under matched-load, phase-locked conditions is $P_N = NP_1 = N \, i_c^2 R/8$ or expressed differently $P_N = i_c^2 R_L/8$. Under these conditions the line width of emitted radiation for a series array of Josephson junctions is $\Delta\nu = \nu = (41 \text{ MHz}/\Omega K) T R_d^2/RN$, where T is the operating temperature and $R_d$ is the differential resistance of a bare Josephson junction.

There are drawbacks to the use of a linear array of Josephson junctions. As described by Jain et al. and Hansen et al. (and other publications in the Appendix) phase locking in series arrays only occurs when the junctions have nearly identical characteristics, and only when certain types of loads are connected to the array. These particular loads are evidently necessary for inducing phase locking through feedback of the radiation emitted from the array. The expense and difficulty of fabricating identical Josephson junctions have resulted in only limited success in totally phase locking series arrays.

In order to compensate for differences in the Josephson junctions constituting a series array, the DC bias current has been symmetrically divided among the junctions. As described by the Wan et al. publication[4] (see Appendix), such an arrangement has resulted in a maximum power of 1 μW at a frequency of 350GHz into a 60Ω load. However, this is still less than the maximum expected power of 7μW that could have been achieved with the same arrangement if all of the Josephson junctions were phase-locked.

Consequently, other techniques must be employed to achieve total phase locking thereby maximizing power output. Two-dimensional arrays of Josephson junctions have been used as described by the Clark publication[5] (see Appendix) and the Mooij et al. publication[6] (see Appendix). However, these publications are limited to small arrays of point contacts and microbridges respectively, coupled to resonant cavities, and requiring high frequency external excitation of the array. Further, as described by Jain et al. and Hansen et al.[3] (and other publications in Appendix) neither of these arrays achieves mutual phase-locking resulting in a coherent power output.

The aforementioned examples fall short of the ideal two-dimensional array which operates with mutual phase locking resulting in a coherent power output.

DISCLOSURE OF THE INVENTION

One object of the present invention is to generate a high frequency signal from a two-dimensional array of Josephson junctions without the use of a cavity resonator or external high frequency signals to excite the array.

Another object is to easily match the output impedance of an array of Josephson junctions to the impedance of a load connected to the array.

A further object is to reliably phase lock each junction in an array of Josephson junctions even if the junctions are non-identical.

Yet a further object is to operate an array of Josephson junctions outputting higher power than that achieved by a linear array of Josephson junctions.

Still a further object of the invention is to operate an array of Josephson junctions to provide a line width which is more narrow than that provided by a linear array of Josephson junctions.

Yet another object is to operate a two-dimensional array of Josephson junctions using only DC excitation for rapid tuning of the output voltage/frequency by changing the current bias.

Still another object of the present invention is to generate a high frequency signal using a magnetically tunable two-dimensional array of Josephson junctions.

An additional object is to mutually phase lock an array of non-hysteretic Josephson junctions.

According to the present invention, a two-dimensional array of superconducting Josephson junctions includes a plurality M of horizontal rows, each of the horizontal rows containing a plurality N of Josephson junctions of a first group, arranged on each of the horizontal rows so that N vertical columns of Josephson junctions are formed in the array, and a plurality of horizontal conductors connecting adjacent Josephson junctions in the same horizontal row. The array also includes a plurality of vertical conductors connecting Josephson junctions of adjacent horizontal rows and intersecting with the horizontal conductors. DC biasing means are arranged so that voltage on each of the Josephson junctions of the first group along a horizontal row is uniform for each horizontal row of Josephson junctions in the array. As a result of this configuration, each of the Josephson junctions of the array is mutually phase locked when excited by an external DC bias.

Another aspect of the invention is a two-dimensional Josephson array voltage-controlled high frequency oscillator having a plurality M of horizontal rows. Each of the horizontal rows contains a plurality N of Josephson junctions of a first group arranged on each of the horizontal rows so that N vertical columns of Josephson junctions are formed in the array, and a plurality of horizontal conductors connecting adjacent Josephson junctions in the same horizontal row. The oscillator also includes a plurality of vertical conductors connecting adjacent horizontal rows and intersecting with the horizontal conductors. DC biasing means are arranged so that voltage on each of the Josephson junctions of the first group along a horizontal row is uniform for each of the rows of Josephson junctions in the array. Each of the Josephson junctions has a predetermined resistance, capacitance and critical current so that each junction is mutually phase-locked when the array is excited by an external DC bias. The result is that the array emits a coherent power at a predetermined frequency.

Yet another aspect of the present invention is a method of generating high-frequency signals with a two-dimensional array of superconducting Josephson junctions arranged in a matrix of vertical columns and horizontal rows. The method consists of applying a tunable DC bias to the array, maintaining a uniform voltage across each of the Josephson junctions along a horizontal row for each horizontal row of Josephson junctions, mutually phase locking each of the Josephson junctions in the array and emitting coherent power at a predetermined frequency from the array.

Still another aspect of the present invention is a method of matching a load to a two-dimensional array of superconducting Josephson junctions arranged in a matrix of horizontal rows and vertical columns. The method includes applying a DC bias to the array, maintaining a uniform voltage across each Josephson junction along a horizontal row or each horizontal row of Josephson junctions, mutually phase locking each of the Josephson junctions in the array and transferring coherent power at a predetermined frequency from the array to the load.

A further aspect of the invention is a method of converting DC voltage to a high frequency AC signal. The method includes applying a DC bias to a two-dimensional array of superconducting Josephson junctions arranged in a matrix of horizontal rows in vertical columns, maintaining a uniform voltage across each Josephson junction along a horizontal row for each horizontal row of Josephson junctions, mutually phase locking each of the Josephson junctions in the array and emitting coherent power at a predetermined frequency from the array.

Yet an additional aspect of the invention is a method of tuning a high frequency oscillator having an array of superconducting Josephson junctions arranged in a matrix of horizontal rows and vertical columns. The method includes exciting the array with a DC bias, maintaining uniform voltage across each horizontal Josephson junction along a horizontal row for each of the horizontal rows of Josephson junctions, mutually phase locking each of the Josephson junctions in the array, applying a commensurate magnetic field in a direction perpendicular to the array and deriving coherent power at a predetermined frequency from the array.

BEST MODE FOR CARRYING OUT THE INVENTION

Figure 1:
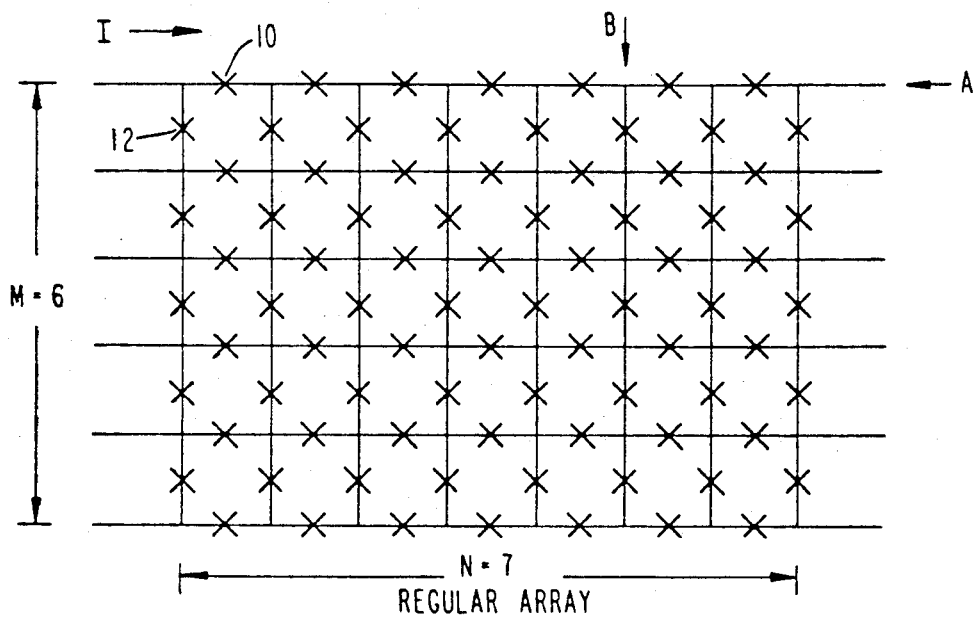
FIG. 1 is a diagram showing the geometry of a regular two-dimensional array, where N=7 and M=6.

One embodiment of the invention is shown by the array in FIG. 1. Josephson junctions 10 along the rows A, parallel to the flow of DC bias current I supplied by a DC current biasing means are in the active voltage state. To achieve mutual phase locking, each of the Josephson junctions 10 must have an identical non-zero voltage across it. In contrast, Josephson junctions 12 arranged along the columns in direction B are required to be in the zero voltage state. The zero voltage state Josephson junctions 12 can be replaced by superconducting wires. Both arrangements are capable of mutually phase locking all the junctions. It is the mutual phase and frequency locking of the active voltage state Josephson junctions in the array which provides a high coherent power output of the array, and an extremely fast tuning function.

DC biasing means applies a DC current to one side of the array and removes it on the other, or connecting a DC current source in parallel with the array so that currents flow through the horizontal junctions. The frequency can be quickly tuned over a wide range by changing the DC bias current, thereby changing the junction voltages.

A key advantage of the two-dimensional array is that the currents inherently redistribute to compensate for non-identical junctions. Consequently, Josephson junctions 10 need not be identical to ensure uniform voltage and phase locking. The junctions 12 insure voltage uniformity in Josephson junctions 10 and can be fabricated with larger critical currents or replaced with superconducting wires having appropriate characteristics. The resistance, critical current, capacitance of junctions 10, as well as the numbers of junctions M and N, can be adjusted for variations in the load circuit or for different frequencies. Thus, a high level of design flexibility results. Because the power dissipation is extremely low, Josephson junction circuits can be packed together as tightly as fabrication techniques permit, providing a high degree of integration and design flexibility.

Fluxoid quantization is another aspect of two-dimensional Josephson junction arrays that apparently leads to phase locking. In four-junction unit cells such as those shown in FIG. 3, fluxoid quantization constrains the phases of junctions in neighboring cells, forcing uniformity among neighboring junctions. Yet another aspect of two-dimensional Josephson junction arrays is the existence of quasi-long-range interactions between the junctions. These interactions make the physics of two-dimensional arrays qualitatively different from those of series arrays, leading to phenomena such as the Kosterlitz-Thouless transition as described in the Kosterlitz et al. publication[8] (see Appendix). This publication discusses the existence of a phase transition temperature, which is close to the critical temperature of Nb used in Josephson junction arrays. It is believed that below the phase transition temperature the Josephson junction phases reach a state of quasi-long-range coherence, locking the phases of neighboring junctions. Thus, the nature of two-dimensional Josephson junction snap provides internal mechanisms that induce coherent phase locking between the junctions without the need for external high frequency excitation or coupling to an external resonant cavity. Feedback from coupling circuits or loads on the array also may induce phase-locking of the junctions.

For two-dimensional arrays such as that shown in FIG. 1, the array resistance is $R_A = NR/M$, and the total array critical current is $I_c = Mi_c$, where N equals the number of junctions, 7 in FIG. 1, and M equals the number of rows, 6 in FIG. 1.

Impedance matching is achieved by choosing the ratio of the length to the width so that $N/M = R_L/R$. The maximum power coupled from a coherent two-dimensional array to a matched load is $$P_{MN} = MNP_1 = M^2 \frac{i_c^2 R_L}{8}$$

The total emitted power is a function of the width M of the array, giving an additional degree of freedom to increase the available output power. This additional degree of freedom also provides the capability of emitting far more power than is practical in a linear or one-dimensional Josephson junction array. A nearly sinusoidal waveform will be output if:

$$N/M = R_L/R > R_L i_c / \phi_0 N.$$

Another advantage of the two-dimensional array is that a substantially narrower radiation line width can be output than for a series array. The line width for a phase-locked two-dimensional Josephson junction array is narrower than that of a single junction by a factor of 1/MN and is expressed as $$\Delta v (Hz) = \frac{4\pi k T R_d^2}{M N \phi_0^2 R}$$

where, $R_d = dV/dI$. Consequently, the two-dimensional Josephson junction array is capable of providing higher power at frequencies more well-defined than that for a series or linear array of Josephson junctions.

Figure 2:
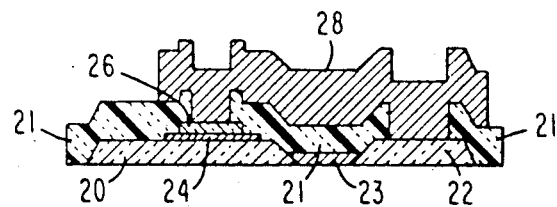
FIG. 2 is a cross-sectional view of a shunted Josephson junction showing the shunt arrangement between the junction and an intersection of conductor lines.
Figure 5:
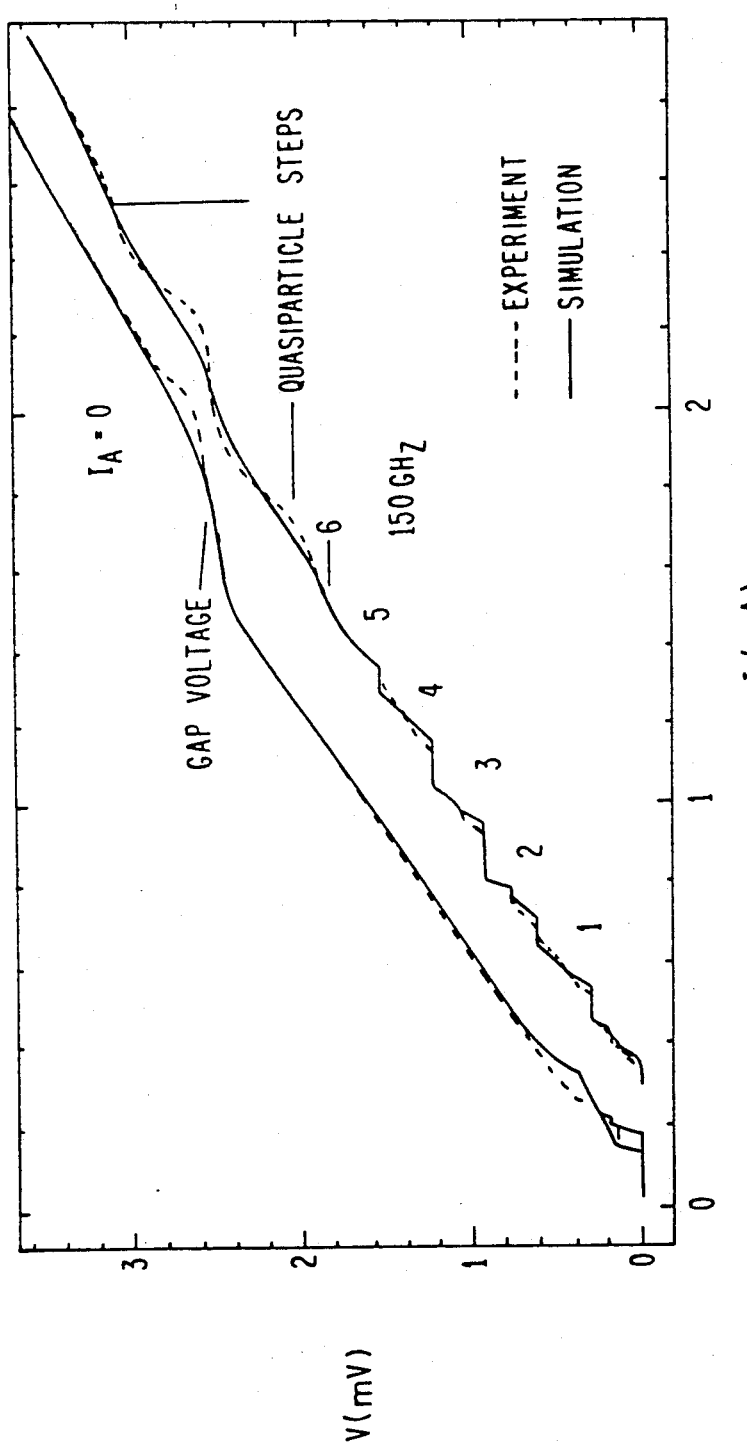
FIG. 5 is a graph showing the current-voltage curves of the detector junction under various conditions and comparing simulated data with experimental data.
Figure 8:
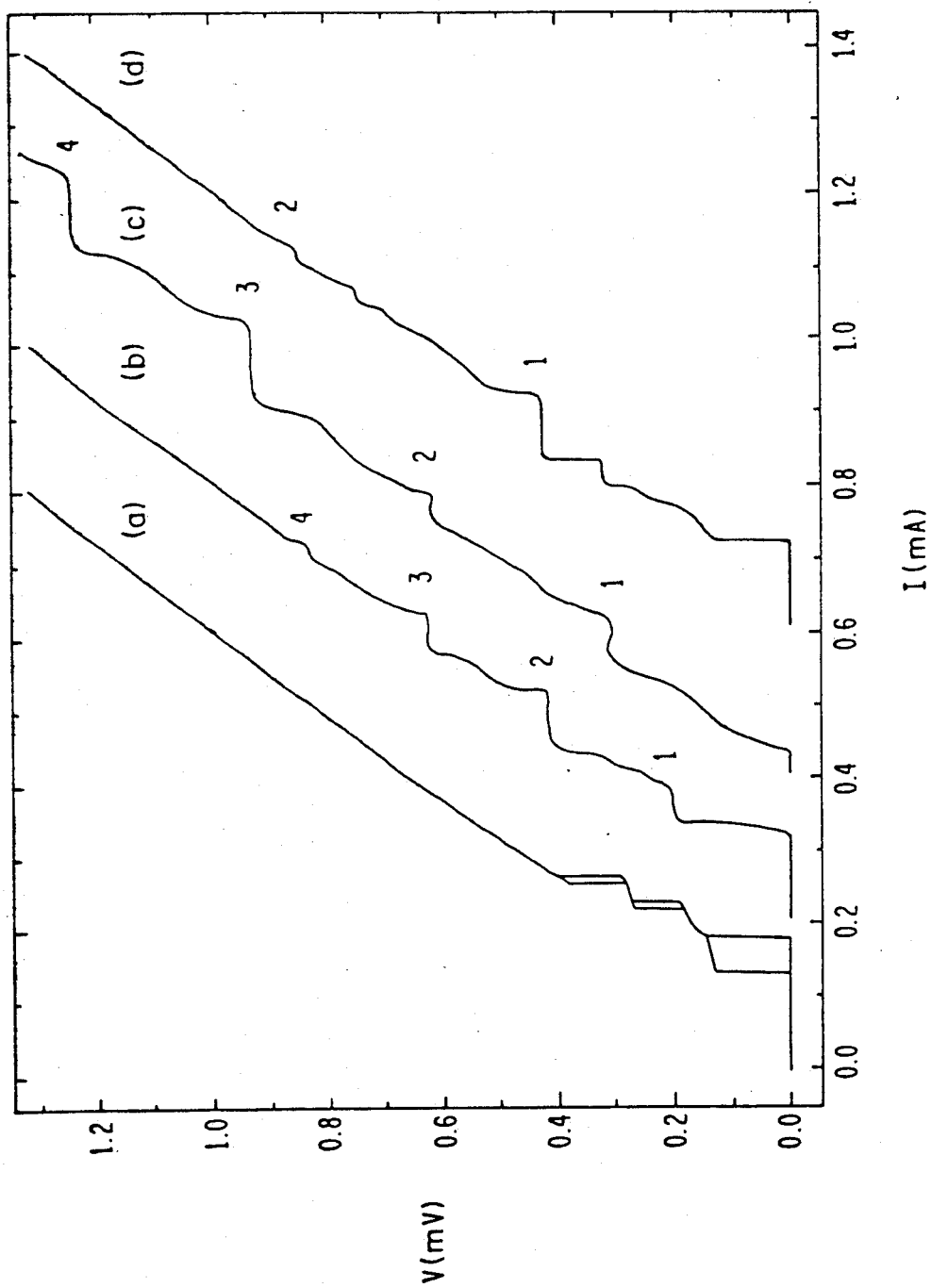
FIG. 8 is a graph showing current-voltage curves experimentally derived at different emission frequencies from the array.

The two-dimensional Josephson junction array and detector were tested and modeled, and found to have the characteristics shown in FIGS. 5 and 8. The Josephson junctions are of the superconductor-insulator-superconductor type. As shown in FIG. 2, the Josephson junction is typically formed by layer 20 of a superconducting material such as Nb, an insulator 24, such as $Al_2O_3$ having a current density of approximately 1000 $A/cm^2$, and a counter-electrode 26 also formed of superconducting Nb. The Josephson junction is isolated by insulating layers 21 formed of SiO. Normally the junction is formed on a silicon substrate (not shown in FIG. 2) having an SiO insulating layer (also not shown).

In order to ensure mutual phase locking for an entire array of Josephson junctions as described in the previous paragraph, for a wide variety of loads, frequencies and power applications, it is occasionally helpful to use certain adjusting mechanisms within the structure of the array and the individual Josephson junctions. One such adjusting mechanism is a shunt resistor 23 connected between lower electrode 20 and superconducting terminal 22. Shunt resistor 23 is typically made of In-Au and typically has a resistance of between 1 and 2$\Omega$. Terminal 22 can be made from a number of superconducting materials such as Nb, and is connected with counterelectrode 26 by shunt wiring 28. The shunt wiring is also a superconductor made of Pb-In-Au.

Figure 3:
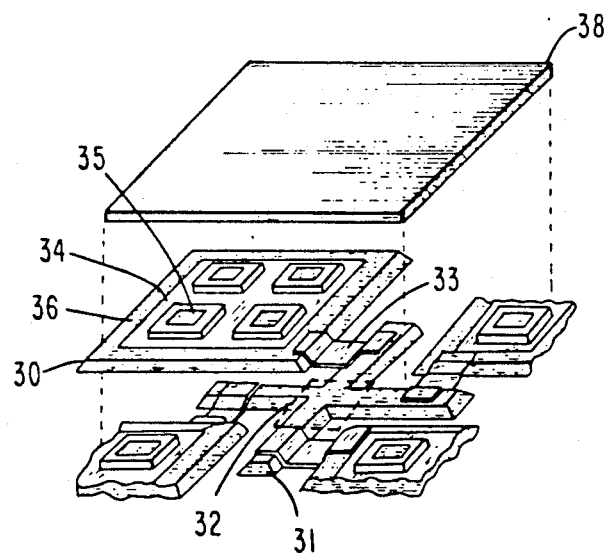
FIG. 3 is a perspective view of a structure used to shunt four Josephson junctions to an adjacent intersection of conductor lines.

As shown in FIG. 3 shunt wiring 38 permits four adjacent Josephson junctions to be connected to a cross-shaped shunt terminal 31 by the same layer. The wiring layer 38 is separated from the shunt by an insulator layer (not shown). Four wiring holes at a position 35 in this insulator allow the wiring layer 38 to contact the four counter electrodes 36 and complete the shunting circuit of each of these four Josephson junctions by contacting the shunt terminal 31 through another insulator hole at a position 32. Electrode 30 is separated from counter electrode 36 by insulator 34. Shunt resistor 33 spans electrode 30 and shunt terminal 31. The value of the shunt resistance RS controls the damping factor $\beta_c = \pi i_c R_s {}^2 C/\phi_o$. If the damping factor $\beta_c$ is less than 0.7, the shunted junction is non-hysteretic. While non-hysteretic junctions are not necessary in all cases to achieve mutual phase locking of all the Josephson junctions, in some extreme cases the use of non-hysteretic Josephson junctions can provide the balance needed to maintain a mutually phase-locked condition for all the Josephson junctions in the array.

Other factors can also be adjusted to maintain the balance needed to maintain mutual phase locking of the array. For example, the critical currents $i_c$ of the junctions can be varied from approximately 0.15-0.3mA by selecting the appropriate junctions so that mutual phase locking is achieved for frequencies of interest. The junction capacitance C, typically 0.4pF, can also be varied by the selection of appropriate Josephson junctions for use in the array. If the tunnel junction is non-hysteretic by itself then the shunt resistor is unnecessary. SNS junctions, which are typically non-hysteretic may also be used.

The inductance parameter of the array unit cells expressed as $\beta_1 = 2\pi i_c L/\phi_o$ where L is the total inductance of the cell can also be used to adjust the balance necessary to maintain mutual phase locking of the array. Normally, the inductance parameter is kept small ($\leq \pi$). This ensures that current vorticies in the array do not become localized, so that the quasi-long-range interactions between the junctions are preserved. Consequently, it is important to be able to adjust the inductances within the array. The inductances can be minimized within the array by minimizing the array area, or by using a ground plane.

A ground plane can be positioned over the device of FIG. 2 by placing additional insulating film such as SiO over shunt wiring layer 28 and placing over the insulating layer a thin layer of superconducting material such as Pd-In-Au. The presence of a ground plane also affects the value of the shunt inductance, and thus the output power of the array (see below).

Figure 7:
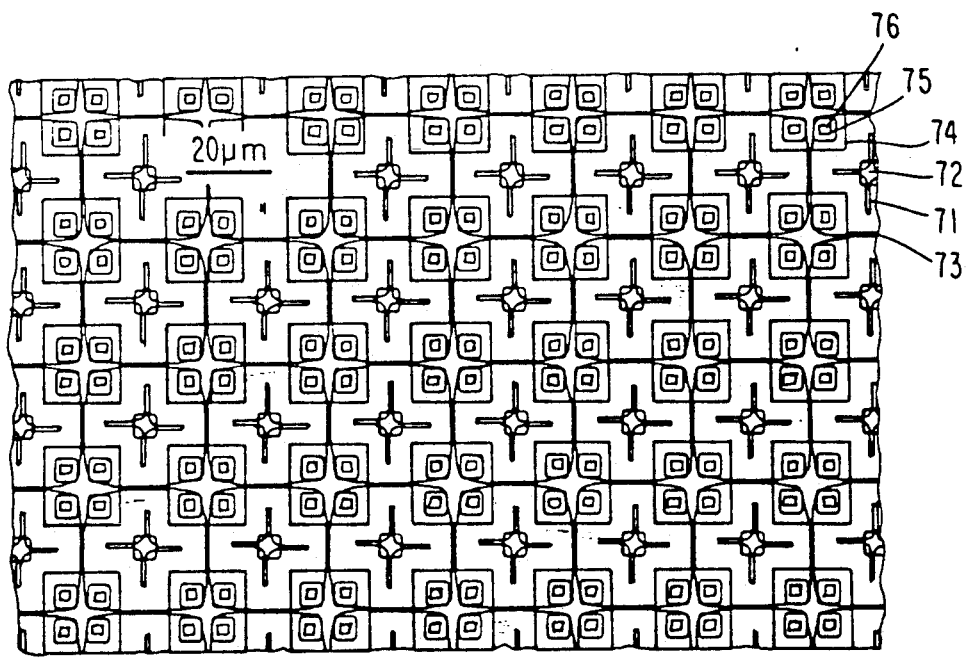
FIG. 7 is a top view showing a pattern of a Josephson junction array.

Array area is minimized by the arrangement shown in FIG. 3. The compact array permitted by the wiring arrangement of FIG. 3 is best shown in a photograph of the real array, FIG. 7. 71 is the cross-shaped shunt terminal and is connected by shunt resistors (not shown) to each of the closest four Josephson junctions around it at the Nb base electrode 74. The Josephson junctions are wired by a shunt wiring layer (73) from counterelectrode 76 through wiring hole 75 to cross-shaped shunt terminal 71 through wiring hole 72. The wiring holes 75 and 72 are surrounded by insulators (not shown). The FIG. 7 arrangement minimizes wasted space and permits an array to be made as small as fabrication techniques permit. The reduction in array area also permits a reduction in the inductance of the wires between the junctions and the parasitic inductance of the shunt resistors.

Figure 4:
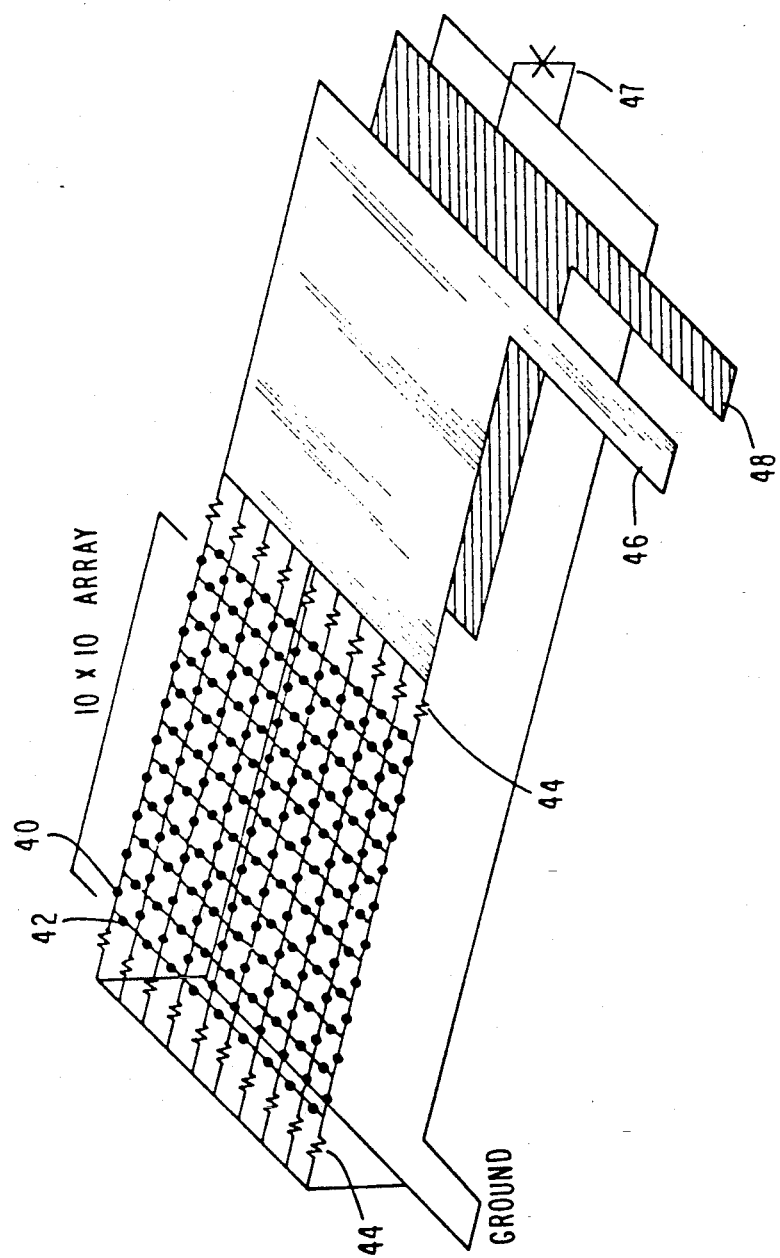
FIG. 4 is a diagram showing the layout of a Josephson junction array using a blocking capacitor as an input and output means.

Input/output functions are performed by a blocking capacitor having plates 46 and 48 as shown in FIG. 4. DC current is applied to plate 46 through resistors 44 into the 10×10 array of Josephson junctions then through resistors 44 and then to ground. The output of the Josephson junction array is obtained by detector junction 47 connected across capacitor plate 48 and ground. Resistors 44 usually have a value of between 0.3 and 0.5Ω each and are used to improve current uniformity in the array of Josephson junctions. The 10 ×10 array shown in FIG. 4 is typical and measures approximately 160μm on a side. As a result of this size, the array junctions are lumped for v<210 GHz, resulting in greater tunability than for non-lumped arrays at higher frequencies when the junction density (number of junctions per unit area) becomes a constraint (i.e., the size of the array is larger than $\frac{1}{4}$ wavelength), then it may be necessary to use distributed two-dimensional arrays, by distributing the junctions 10 at wavelength intervals (see ref. 4 in the Appendix). For arrays in which a ground plane is not used, the capacitor plates are positioned adjacent the array to minimize inductance in the coupling circuit. A typical blocking capacitor for the arrangement shown in FIG. 4 has a capacitance of 9.5pF when a ground plane is arranged over the entire circuit. Typically the critical currents of the Josephson junctions are approximately 0.18mA and the shunt resistances are approximately 1.65Q. The blocking capacitor is approximately 150μm wide and approximately 460μm long. The width of the blocking capacitor matches that of the array and minimizes the impedance of the coupling circuit, thus maximizing the power to the detector junction 47. Feedback from this coupling circuit into the array may also induce phase-locking of the junctions.

Another method of adjusting an oscillator formed by a two-dimensional array of Josephson junctions is by magnetically tuning the oscillator through the application of appropriate commensurate magnetic fields perpendicular to the plane of the array. A commensurate magnetic field is one that is applied perpendicular to the array so that vortices of currents are injected and arranged in ordered superlattices on the array. Such magnetic tuning can be performed because of the existence of the fluxoid quantization occurring in a two-dimensional array of Josephson junctions. This can occur when vortex superlattices are present in the array (see S.P. Benz et al., both publications, reference 7 of the Appendix).

FIG. 8 shows experimental I-V curves for three different frequencies where substantial power was coupled to the detector junction, 100 GHz, 150 GHz, and 205 GHz, as well as the case where there is no bias current through the array. When $I_A=0$, the array is in the zero-voltage state so no power is emitted and the detector junction shows no steps. The substantial parasitic capacitance between the blocking capacitor and ground is in parallel with the detector junction, so the effective $\beta_c$ is greater than 1 and the I-V curve is slightly hysteretic. The higher voltage hysteretic regions are a result of resonances in the coupling circuit. These resonances probably explain the frequency dependence of the power transmitted to the detector junction. In particular, the coupling circuit couples no power to the detector junction at 110 GHz, probably because the length of the blocking capacitor is one-half wavelength at this frequency. The greatest power is coupled to the detector junction at 150 GHz. Shapiro steps are observed up to n=6, as well as quasiparticle-induced steps above and below the gap voltage (as shown in FIG. 5).

Figure 6:
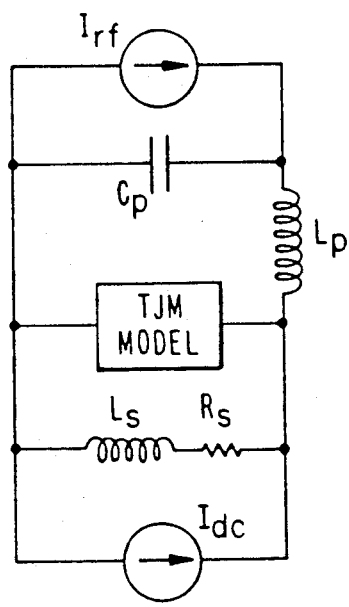
FIG. 6 is a circuit diagram of a model used to simulate power coupled to a detector junction used as an output load for a Josephson junction array.

In order to estimate the power dissipated in the detector junction at 150 GHz, the approximate model shown in FIG. 6 was used to simulate the experimental circuit. The tunnel junction microscopic (TJM) model (Likharev 1986) was used for the Nb/Al$_2$O$_3$/Nb tunnel junction, in order to correctly model the gap voltage and quasiparticle-induced steps in FIG. 5. The TJM model parameters i$_c$=0.18 mA, C=0.4 pF, R$_N$=6.2Ω, V$_g$=2.52 mV, and R$_{sg}$=150Ω are the junction critical current, capacitance, normal state resistance, gap voltage, and subgap resistance respectively, and were experimentally determined from unshunted test junctions on the same chip. The junction capacitance, C (effectively, $\beta_c$), is determined experimentally from test junctions by varying the shunt resistance. The resistance and inductance of the shunt are Rs=1.65Ω and L$_s$=1.45 pH. The shunt inductance is an important parasitic that affects the power dissipated in R$_s$. I$_{dc}$ is the dc bias current for the detector junction. The two-dimensional array and blocking capacitor are modeled together as an rf current source with amplitude I$_{rf}$. The parasitic inductance, L$_p$=6.8 pH, and capacitance, C$_p$=4.1 pF, of the dc-blocking capacitor and coupling circuit are included in the model. The values for L$_s$, L$_p$ and C$_p$ were estimated using the measured dimensions of the films Including L$_p$ and C$_p$ improved the fit of the simulations to the experiment in particular the slope of the I-V curves between steps was improved.

The circuit of FIG. 6 was simulated with different rf amplitudes at 150 GHz until the step widths closely matched the experimental results. The resulting I-V curves are shown as solid lines in FIG. 5, and plotted on top of the experimental results (dashed lines). Both simulated I-V curves are excellent fits to the experimental curves. The gap and quasiparticle steps are not as sharp in the simulations because the TJM model does not account for the additional "knee" at the gap voltage due to the proximity effect in the aluminum barrier. Also, the stripline capacitor resonances in the experimental I$_A$=0 curve between 0.2 and 0.4 mV in FIG. 8 (curve a) are not accurately modeled by the subject simplified coupling circuit. However, the shunt inductance causes the resonance bump at approximately 0.4 mV in the simulated I$_A$=0 curve in FIG. 5, as experimentally observed in shunted test junctions.

The power dissipated in the shunt resistor for the 150 GHz emission frequency was then found by calculating the instantaneous voltage waveform, V$_s$(t), across R$_s$ at I$_{dc}$=0. By squaring this waveform and then averaging over a single rf period, the dissipated power in R$_s$ was found to be P=<V$_s$(t)$^2$>/R$_s$≈0.4μW. This result is surprisingly very close to the maximum power coupled to a matched load from a two-dimensional array of shunted junctions. According to P$_{MN}$=1/8 M$^2$i$_c^2$R$_L$, P$_{MN}$~0.7μW, assuming R$_L$~R$_s$=1.65Ω. There is, however, a correction to this equation due to the shunt inductance of the array junctions, that leads to higher emitted power. If a single junction current source is shunted by a series inductance, L'$_s$, resistance, R'$_s$ and then coupled to an arbitrary load of complex impedance, Z$_L$=R$_L$+iX, the maximum power coupled to the load resistance is larger than P$_1$ by a factor of $[1+(2\pi\nu L'_s/R'_s)^2]$. This correction holds provided that:

$$R'^2_{sg} = R_s^2 - (2\pi\nu L_s)^2$$

and that the available power does not exceed $(2/3^{3/2})i_c\phi_0\nu$. The increased power is due to the resonance between L'$_s$ and C in the junction, and may be a useful parameter for tuning the oscillator to higher power over a narrow frequency range. Thus for a two-dimensional array of shunted junctions, the maximum power coupled to a matched load becomes:

$$P_{MN} = M^2 \frac{i_c^2 R_L}{8} \left[ 1 + \left( \frac{2\pi\nu L'_s}{R'_s} \right)^2 \right]$$

At 150 GHz the maximum power coupled to R$_s$ should be 1.1μW, for L'$_s$=1.45 pH and R'$_s$=R$_s$=1.65Ω, since the shunts across the array junctions are identical to that of the detector junction. Thus, the estimated power coupled to the detector junction at 150 GHz is approximately 33% of the maximum possible power according to the equation above, which does not include possible losses due to impedance mismatching as a result of the coupling circuit. Since the estimated power at 150 GHz is very close to the maximum possible power coupled to a perfectly matched load, it can be concluded that virtually all of the junctions in the array are phase locked and that this coherently generated power is efficiently coupled to the detector junction.

Although a number of arrangements of the invention have been mentioned by way of example, it is not intended that the invention be limited thereto. For example, since a two-dimensional array oscillator does not require hysteretic junctions, the oscillator can be made of any hysteretic or non-hysteretic junctions such as those that currently exist using high-temperature superconductors, thus making operation possible for the invention at liquid nitrogen temperatures. Any type of superconducting material, normal conductor or insulating material found to be appropriate can be used in the Josephson junctions of the array. Any of the various types of Josephson junctions can be used in the array, in virtually any two-dimensional configuration in which mutual phase-locking occurs. Any number N, M of Josephson junctions can be used as appropriate for existing load, frequency and power requirements. Accordingly, the invention should be considered to include any and all configurations, modifications, variations, combinations or equivalent arrangements falling within the scope of the following claims.

APPENDIX

[1] R.P. Robertazzi and R.A. Buhrman, IEEE Trans. Mag., 25, 1384 (1989).

[2] D.R. Tilley, Phys. Lett. 33A, 205 (1970).

[3] For reviews of this subject see A.K. Jain, K.K. Likharev, J.E. Lukens, and J.E.Sauvageau, Phys. Rep. 109, 309 (1984); and J. Bindslev Hansen and P.E. Lindelof, Rev. Mold. Phys. 56, 431 (1984); P. Hadley, M.R. Beasley, and K. Wiesenfeld, Phys. Rev. B 38, 8712 (1988).

[4] K. Wan, A.K. Jain, and J.E. Lukens, Appl. Phys. Lett. 54, 1805 (1989); K.L. Wan, A.K. Jain, and J.E. Lukens, IEEE Trans. Mag. MAG-27, 3339 (1991).

[5] T.D. Clark, Phys. Rev. B 8, 137 (1973).

6J.E. Mooij, C.A. Gorter, and J.E. Noordam, Rev. Phys. Appl. 9, 173 (1974).

7S.P. Benz, M.S. Rzchowski, M. Tinkham, and C.J. Lobb, Phys. Rev. Lett. 64, 693 (1990); S.P. Benz, PhD. thesis, Harvard University (1990).

8J.M. Kosterlitz and D.J. Thouless, J. Phys. C 6, 1181 (1973).

9Benz SP and Burroughs CJ 1991 to appear in 13 May Applied Physics Letters 58.

What is claimed is:

1. A two-dimensional array of superconducting Josephson junctions comprising:
 a plurality M of horizontal rows, each said horizontal row containing
  a plurality N of Josephson junctions of a first group, said Josephson junctions arranged on each said horizontal row so that N vertical columns of Josephson junctions are formed in the array; and
  a plurality of horizontal conductors connecting adjacent Josephson junctions in the same horizontal row;
 a plurality of vertical conductors connecting Josephson junctions of adjacent horizontal rows and intersecting with said horizontal conductors;
 DC biasing means arranged so that the voltage on each said Josephson junction of said first group along a horizontal row is uniform for each horizontal row of Josephson junctions in said array;
 whereby each said Josephson junction of said array is mutually phased locked when excited by an external DC bias.

2. The array of claim 1 wherein said Josephson junctions are of the superconductor-insulator-superconductor type.

3. The array of claim 2 wherein each said Josephson junction comprises an upper superconducting electrode and a lower superconducting electrode, said superconducting electrodes being separated from each other by a first insulator.

4. The array of claim 3 wherein each said Josephson junction is connected to a corresponding intersection of a horizontal conductor and a vertical conductor by a superconducting shunt extending from said upper electrode to said intersection, and by a shunt resistor extending from said lower electrode to said intersection.

5. The array of claim 4 wherein said superconducting shunt is covered by an insulating layer, and said insulating layer is covered by a superconducting ground plane.

6. The array of claim 5 wherein said superconducting electrodes, said superconducting shunt and said superconducting ground plane are selected from a group of materials comprising Nb and Pb-In-Au, said first insulator comprising $Al_2O_3$, said shunt resistor comprising In-Au, and said insulating layer comprising SiO.

7. The array of claim 5 wherein said superconducting electrodes, shunts and ground plane are formed of a high temperature superconducting material.

8. The array of claim 4 wherein each said Josephson junction has a damping factor less than 0.7 whereby said Josephson junctions are substantially non-hysteretic.

9. The array of claim 1 further comprising a second group of Josephson junctions, each of said second group of Josephson junctions being connected to corresponding intersections of vertical and horizontal conductors wherein each said Josephson junction of said second group is maintained at a zero voltage state when an external DC bias is applied to said array.

10. The array of claim 9 wherein N and M are equal.

11. A two-dimensional Josephson array voltage-controlled high frequency oscillator comprising:
 (a) a plurality M of horizontal rows, each said horizontal row containing
  a plurality N of Josephson junctions of a first group, said Josephson junctions arranged on each said horizontal row so that N vertical columns of Josephson junctions are formed in the array; and
  a plurality of horizontal conductors connecting adjacent Josephson junctions in the same horizontal row;
 (b) a plurality of vertical conductors connecting adjacent horizontal rows and intersecting with said horizontal conductors;
 (c) DC biasing means arranged so that voltage on each said Josephson junction of said first group along a horizontal row is uniform for each said row of Josephson junctions in said array; and
 (d) each said Josephson junction having predetermined resistance, capacitance and critical current;
 whereby each said Josephson junction is mutually phased locked so that the entire array emits coherent power at a predetermined frequency when excited by an external DC bias.

12. The oscillator of claim 11 wherein said Josephson junctions are of the superconductor, insulator-superconductor type.

13. The oscillator of claim 12 wherein each said Josephson junction comprises an upper superconducting electrode and a lower superconducting electrode, said superconducting electrodes being separated from each other by a first insulator.

14. The oscillator of claim 13 wherein each said Josephson junction is connected to a corresponding intersection of a horizontal conductor and a vertical conductor by a superconducting shunt extending from said upper electrode to said intersection, and by a shunt resistor extending from said lower electrode to said intersection.

15. The oscillator of claim 14 wherein said superconducting shunt is covered by an insulating layer, said insulating layer being covered by a superconducting ground plane.

16. The oscillator of claim 15 wherein said superconducting electrodes, said superconducting shunt and said superconducting ground plane are selected from a group of materials comprising Nb and Pb-In-Au, said first insulator comprising $Al_2O_3$, said shunt resistor comprising In-Au, and said insulating layer comprising SiO.

17. The oscillator of claim 11 further comprising a second group of Josephson junctions, each of said second group of Josephson junctions being connected to corresponding intersections of vertical and horizontal conductors;
 wherein each said Josephson junction of said second group is maintained at a zero voltage state when DC bias is applied to said array.

18. The oscillator of claim 11 wherein said DC biasing means further comprises a blocking capacitor, a first plate of said blocking capacitor being arranged to supply external DC bias to a first side of said two-dimensional Josephson junction array.

19. The oscillator of claim 18, wherein said oscillator is connected to a load having a predetermined impedance, the resistance, capacitance and critical current of said Josephson junctions and N being selected to have values such that an output impedance of the two-dimensional Josephson junction array oscillator equals the impedance of said load.

20. The oscillator of claim 19 wherein said load is connected to a second plate of said blocking capacitor.

21. The oscillator of claim 20, further comprising a first plurality of resistors, each connected between said first plate of said blocking capacitor and said first side of said two-dimensional Josephson junction array; and
a second group of resistors, each connected between ground and a second side of the two-dimensional Josephson junction array opposite that connected to said blocking capacitor.

22. The oscillator of claim 11 wherein each said Josephson junction has a damping factor less than 0.7 wherein each said Josephson junction is substantially non-hysteretic.

23. The oscillator of claim 18 wherein said blocking capacitor has a value of 9.5 pF.

24. The oscillator of claim 11 wherein said two-dimensional array produces an output line width proportional to 1/NM.

25. The oscillator of claim 11 wherein the critical current of each said Josephson junction is between 0.15 and 0.3mA.

26. The oscillator of claim 14 wherein said emitted coherent power is equal to $$P_{MN} = M^2 \frac{i_c^2 R_L}{8}$$

where M is the number of horizontal conductor lines, $R_L$ is the load resistance, and $i_c$ the critical current of each Josephson junction.

27. The array of claim 11 wherein said predetermined frequency equals:

$$v = V/\phi_o$$

where V is the time-average voltage across the junction and $\phi_0 = 2.07$ mV/THZ.

28. A method of generating voltage tunable high-frequency signals with a two-dimensional array of superconducting Josephson junctions arranged in a matrix of vertical columns and horizontal rows, comprising the steps of:
(a) applying a tunable DC bias to said array;
(b) maintaining a uniform voltage across each said Josephson junction along a horizontal row for each horizontal row of Josephson junctions;
(c) mutually phase locking each said Josephson junction in said array; and
(d) emitting coherent power at a predetermined frequency from said array.

29. The method of claim 28 wherein said predetermined frequency is in the range of 60 to 210 GHz.

30. The method of claim 28 wherein said emitted coherent power has a value of 0.4μW.

31. The method of claim 28 wherein said emitted coherent output is a nearly sinusoidal waveform.

32. A method of matching a load to a two-dimensional array of superconducting Josephson junctions arranged in a matrix of horizontal rows and vertical columns, comprising the steps of:
(a) applying a DC bias to said array;
(b) maintaining a uniform voltage across each said Josephson junction along a horizontal row for each horizontal row of said Josephson junctions;
(c) mutually phase locking each said Josephson junction in said array; and
(d) transferring coherent power at a predetermined frequency from said array to said load.

33. A method of converting DC voltage to a high-frequency AC signal comprising the steps of:
(a) applying a DC bias to a two-dimensional array of superconducting Josephson junctions arranged in a matrix of horizontal rows and vertical columns;
(b) maintaining a uniform voltage across each said Josephson junction along a horizontal row for each horizontal row of Josephson junctions;
(c) mutually phase locking each said Josephson junction in said array; and
(d) emitting coherent power at a predetermined frequency from said array.

34. A method of tuning a high frequency oscillator having a two-dimensional array of superconducting Josephson junctions, arranged in a matrix of horizontal rows and vertical columns, comprising the steps of:
(a) exciting said array of Josephson junctions with a DC bias;
(b) maintaining uniform voltage across each horizontal Josephson junction along a horizontal row for each horizontal row of Josephson junctions;
(c) mutually phase locking each said Josephson junction in the array;
(d) applying a magnetic field in a direction perpendicular to the plane of the two-dimensional array; and
(e) deriving coherent power at a predetermined frequency from said array.

* * * * *